United States Patent
Pertuit et al.

(10) Patent No.: US 8,760,294 B2
(45) Date of Patent: Jun. 24, 2014

(54) ELECTRONIC DEVICE HAVING AN ELECTRONIC COMPASS ADAPTED TO DETECT WHEN THE DEVICE IS IN A HOLSTER

(75) Inventors: Michael Pertuit, Richardson, TX (US); Jace William Files, Garland, TX (US); Marc Edward Holbein, Kitchener (CA)

(73) Assignee: Blackberry Limited, Waterloo (CA)

( * ) Notice: Subject to any disclaimer, the term of this patent is extended or adjusted under 35 U.S.C. 154(b) by 402 days.

(21) Appl. No.: 12/984,701

(22) Filed: Jan. 5, 2011

(65) Prior Publication Data

US 2012/0170177 A1 Jul. 5, 2012

(51) Int. Cl.
*G08B 13/14* (2006.01)

(52) U.S. Cl.
USPC ........ 340/568.1; 340/500; 340/540; 455/574; 455/572; 455/575.1; 455/575.8

(58) Field of Classification Search
USPC ............... 340/568.1, 500, 540; 455/574, 572, 455/575.1, 575.8
See application file for complete search history.

(56) References Cited

U.S. PATENT DOCUMENTS

| | | | |
|---|---|---|---|
| 5,642,102 A * | 6/1997 | Panther et al. ............... | 340/7.55 |
| 6,236,868 B1 * | 5/2001 | Lygas ........................ | 455/569.2 |
| 6,983,169 B2 | 1/2006 | Vogel et al. | |
| 7,076,267 B2 * | 7/2006 | Vander Veen et al. ..... | 455/550.1 |
| 7,103,471 B2 * | 9/2006 | Levi et al. ..................... | 701/494 |
| 7,231,226 B2 * | 6/2007 | Vander Veen et al. ..... | 455/550.1 |
| 7,288,934 B1 | 10/2007 | Ikarashi et al. | |
| 7,454,239 B2 * | 11/2008 | Infanti ........................ | 455/575.8 |
| 7,519,388 B2 * | 4/2009 | Vander Veen et al. ..... | 455/550.1 |
| 7,523,012 B2 | 4/2009 | Shah et al. | |
| 7,536,562 B2 | 5/2009 | Little et al. | |
| 7,555,326 B2 * | 6/2009 | Infanti ........................ | 455/575.8 |
| 7,612,559 B2 * | 11/2009 | Koivuaho ..................... | 324/244 |
| 8,188,868 B2 * | 5/2012 | Case, Jr. ..................... | 340/573.1 |
| 8,583,195 B2 * | 11/2013 | Dearden ..................... | 455/575.4 |
| 8,626,471 B2 * | 1/2014 | Kennedy et al. .............. | 702/141 |
| 2006/0022822 A1 | 2/2006 | Wong et al. | |
| 2006/0073819 A1 | 4/2006 | Lowles | |
| 2008/0191892 A1 | 8/2008 | Kirkup et al. | |
| 2009/0009233 A1 * | 1/2009 | Shah et al. .................... | 327/511 |

(Continued)

FOREIGN PATENT DOCUMENTS

| | | |
|---|---|---|
| EP | 1780505 A2 | 5/2007 |
| EP | 2194694 A1 | 6/2010 |
| GB | 2424339 B | 5/2007 |

OTHER PUBLICATIONS

Extended European search report issued May 31, 2011 in respect of corresponding European Application No. 11150218.3.

(Continued)

*Primary Examiner* — George Bugg
*Assistant Examiner* — Naomi Small
(74) *Attorney, Agent, or Firm* — Novak Druce Connolly Bove + Quigg LLP

(57) ABSTRACT

According to one aspect, a portable electronic device sized and shaped to be received within a holster having a magnetic element. The portable electronic device includes an electronic compass adapted to measure a magnetic field of the magnetic element in at least two axes. When the measured pattern corresponds to a first pattern, the portable electronic device is adapted to determine that the portable electronic device is in the holster.

20 Claims, 9 Drawing Sheets

(56) References Cited

U.S. PATENT DOCUMENTS

| | | |
|---|---|---|
| 2009/0104976 A1* | 4/2009 | Ouwerkerk et al. ............ 463/22 |
| 2009/0132198 A1 | 5/2009 | Ito et al. |
| 2010/0081473 A1 | 4/2010 | Chatterjee et al. |
| 2011/0054834 A1* | 3/2011 | Partridge et al. ............. 702/150 |
| 2011/0092155 A1* | 4/2011 | Piemonte et al. ............ 455/41.1 |
| 2011/0312349 A1* | 12/2011 | Forutanpour et al. ......... 455/466 |

OTHER PUBLICATIONS

Aichi Steel, AMI304 Specifications.
Excerpt from http://www.aichi-mi.com/.

* cited by examiner

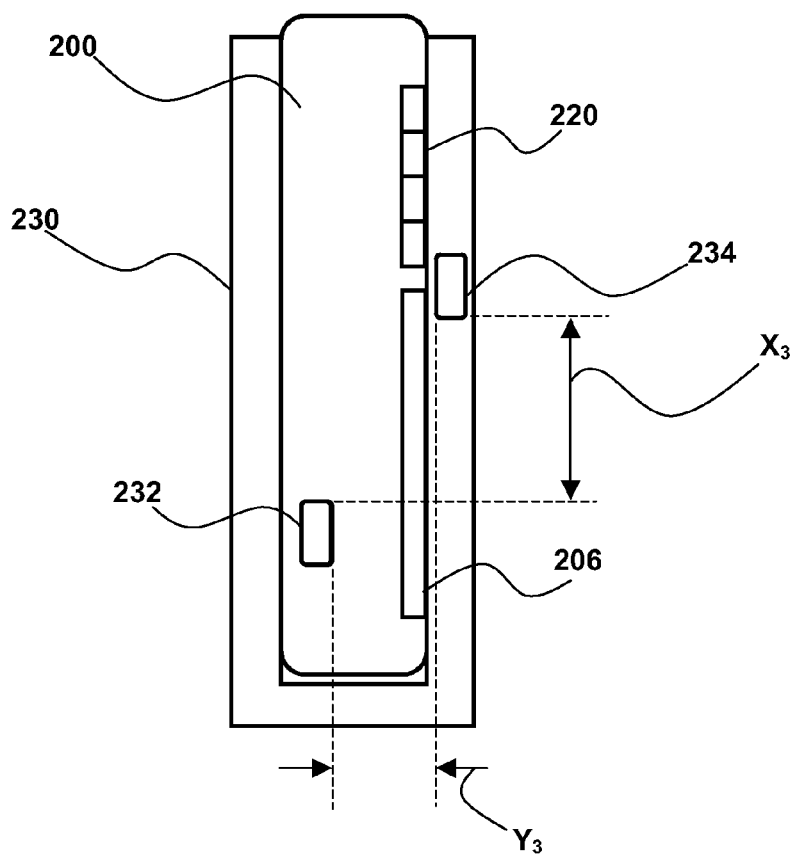
FIG. 8
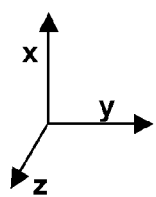

US 8,760,294 B2

ELECTRONIC DEVICE HAVING AN ELECTRONIC COMPASS ADAPTED TO DETECT WHEN THE DEVICE IS IN A HOLSTER

FIELD

Embodiments herein relate to portable electronic devices, and in particular to portable electronic devices having an electronic compass adapted to detect when the device is received in a holster.

INTRODUCTION

Electronic devices, including portable electronic devices, have gained widespread use and may provide a variety of functions including, for example, telephonic, electronic text messaging and other personal information manager (PIM) application functions. Portable electronic devices can include several types of devices including for example cellular phones, smart phones, Personal Digital Assistants (PDAs), tablets and laptop computers.

Devices such as PDAs or smart phones are generally intended for handheld use and ease of portability, and smaller devices may be generally desirable for portability and for use with a user's hands.

In some cases, portable electronic devices may be touch sensitive devices. For example, some devices may include a display (e.g. a liquid crystal display (LCD)) with a touch-sensitive overlay and may be particularly useful where limited space is available for user input and output devices.

In some cases, portable electronic devices may include a keypad having a plurality of keys and one or more other function buttons in addition to a display. Other devices may not have a keypad.

BRIEF DESCRIPTION OF THE DRAWINGS

Embodiments of the present disclosure will now be described, by way of example only, with reference to the attached figures, in which:

FIG. 8 is a schematic side view of the portable electronic device and the holster of FIG. 4 with the portable electronic device received in the holster in a third orientation.

DETAILED DESCRIPTION

Figure 1:
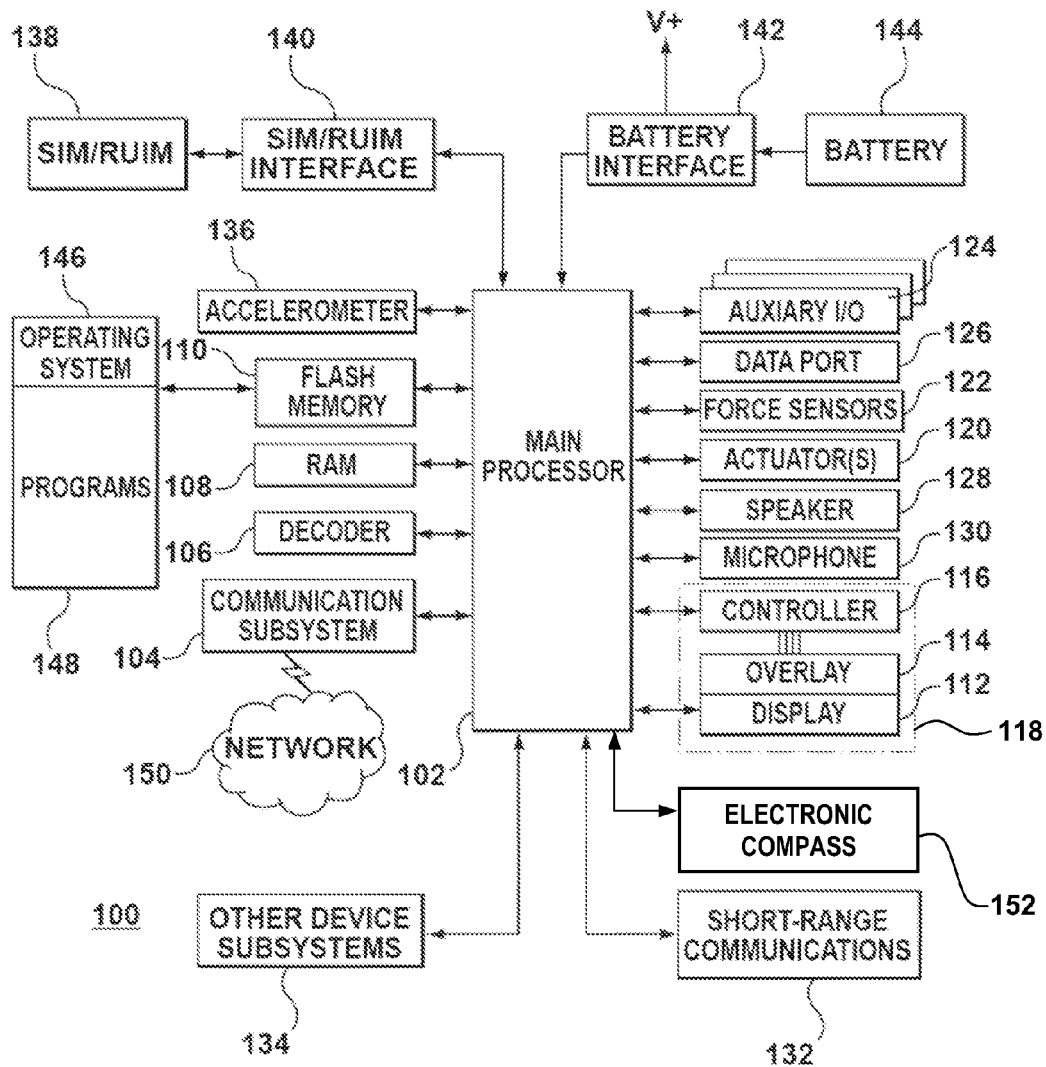
FIG. 1 is a simplified block diagram of components of a portable electronic device according to one embodiment.

It will be appreciated that for simplicity and clarity of illustration, where appropriate, reference numerals may be repeated among the figures to indicate corresponding or analogous elements. In addition, numerous specific details are set forth in order to provide a thorough understanding of the example embodiments described herein. In some instances, well-known methods, procedures and components have not been described in detail so as not to obscure the example embodiments described herein.

FIG. 1 shows a simplified block diagram of components of a portable electronic device 100 according to one embodiment. As shown, the portable electronic device 100 includes multiple components, including for example a processor 102 that controls the operations of the portable electronic device 100. Communication functions, including data communications, voice communications, or both may be performed through a communication subsystem 104. In some embodiments, data received by the portable electronic device 100 may be decompressed and decrypted by a decoder 106.

The portable electronic device 100 may be a battery-powered device and as shown may include a battery interface 142 for receiving one or more batteries 144.

The communication subsystem 104 may receive messages from and send messages to a wireless network 150. The wireless network 150 may be any type of wireless network, including, but not limited to, data-centric wireless networks, voice-centric wireless networks, and dual-mode networks that support both voice and data communications. The processor 102 generally interacts with subsystem components such as a Random Access Memory (RAM) 108, a flash memory 110, and a display 112 (which may have a touch-sensitive overlay 114 connected to an electronic controller 116 that together comprise a touch-sensitive display 118, also be referred to as a touchscreen display). Information, such as text, characters, symbols, images, icons, and other items may be displayed on the touch-sensitive display 118.

In some embodiments, user-interaction with the graphical user interface may be performed through the touch-sensitive overlay 114. In particular, the processor 102 may interact with the touch-sensitive overlay 114 via the electronic controller 116.

Other components could include an actuator assembly 120, one or more optional force sensors 122, an auxiliary input/output (I/O) subsystem 124, a data port 126, one or more speakers 128, a microphone 130, a short-range communications module 132 and other device subsystems 134.

The processor 102 may also interact with an accelerometer 136 as shown in FIG. 1. The accelerometer 136 may be used for detecting direction of gravitational forces or gravity-induced reaction forces.

In some embodiments, to identify a user as a subscriber for network access, the portable electronic device 100 may use a Subscriber Identity Module or a Removable User Identity Module (SIM/RUIM) card 138 inserted into a SIM/RUIM interface 140 for communication with a network, such as the wireless network 150. Alternatively, user identification information may be programmed into the flash memory 110, or via other techniques.

The portable electronic device 100 also generally includes an operating system 146 and software components 148 that are executed by the processor 102. The operating system 146 and software components 148 may be stored in a persistent store such as the flash memory 110 or another data storage device. Additional applications may be loaded onto the portable electronic device 100 through the wireless network 150, the auxiliary I/O subsystem 124, the data port 126, the short-range communications subsystem 132, or any other suitable device subsystem 134.

In use, a received signal such as a text message, an e-mail message, or web page download may be processed by the communication subsystem 104 and input to the processor 102. The processor 102 may then process the received signal for output to the display 112 or alternatively to the auxiliary I/O subsystem 124. In some embodiments, a user may compose data items, such as e-mail messages, for example, which may be transmitted over the wireless network 150 through the communication subsystem 104.

For voice communications, the overall operation of the portable electronic device 100 may be similar. For example, the speaker 128 may output audible information converted from electrical signals, and the microphone 130 may convert audible information into electrical signals for processing.

As shown, the portable electronic device also includes an electronic compass 152. The electronic compass 152 may facilitate location and direction based services, such as navigation, by sensing the position of the portable electronic device 100 in relation to one or more magnetic fields, particularly the Earth's magnetic field.

In some embodiments, the electronic compass 152 may include a magnetometer. The magnetometer may include a multi-axis magneto-impedance sensor (e.g. a three-axis magneto-impedance sensor) or another suitable sensor.

For example, the electronic compass 152 may include three magneto-impedance (MI) sensors within a single integrated circuit package, each MI sensor operable to detect a magnetic field along a particular axis. The portable electronic device 100 can use signals from the MI sensors to determine direction or location information (or both) for the portable electronic device 100, which may be useful for navigating using the portable electronic device 100 for example.

Figure 2:
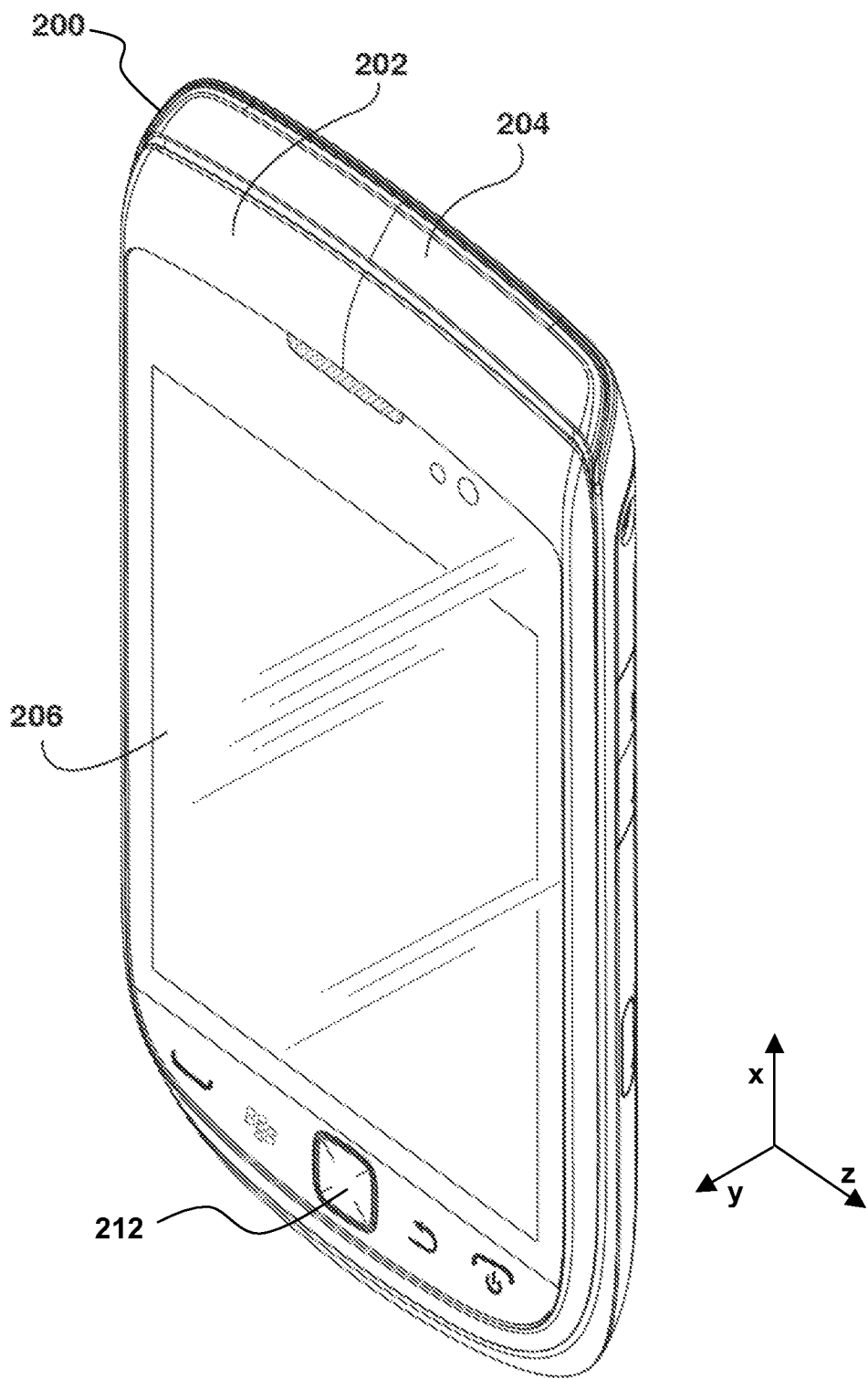
FIG. 2 is a first perspective view of a portable electronic device according to one embodiment shown in a closed position.

In particular, in a three-axis magneto-impedance sensor, magnetic fields may be measured along each of three orthogonal axes (e.g. x-axis, y-axis and z-axis as shown in FIG. 2). Accordingly, the position and direction of the portable electronic device 100 with respect to the Earth's magnetic field can be determined to a generally desired degree of accuracy, depending on the characteristics of the electronic compass 152.

Some examples of suitable three-axis magneto impedance sensors for the electronic compass 152 include sensors from Aichi Micro Intelligent Corporation, such as the AMI304 and AMI306 sensors.

Figure 3:
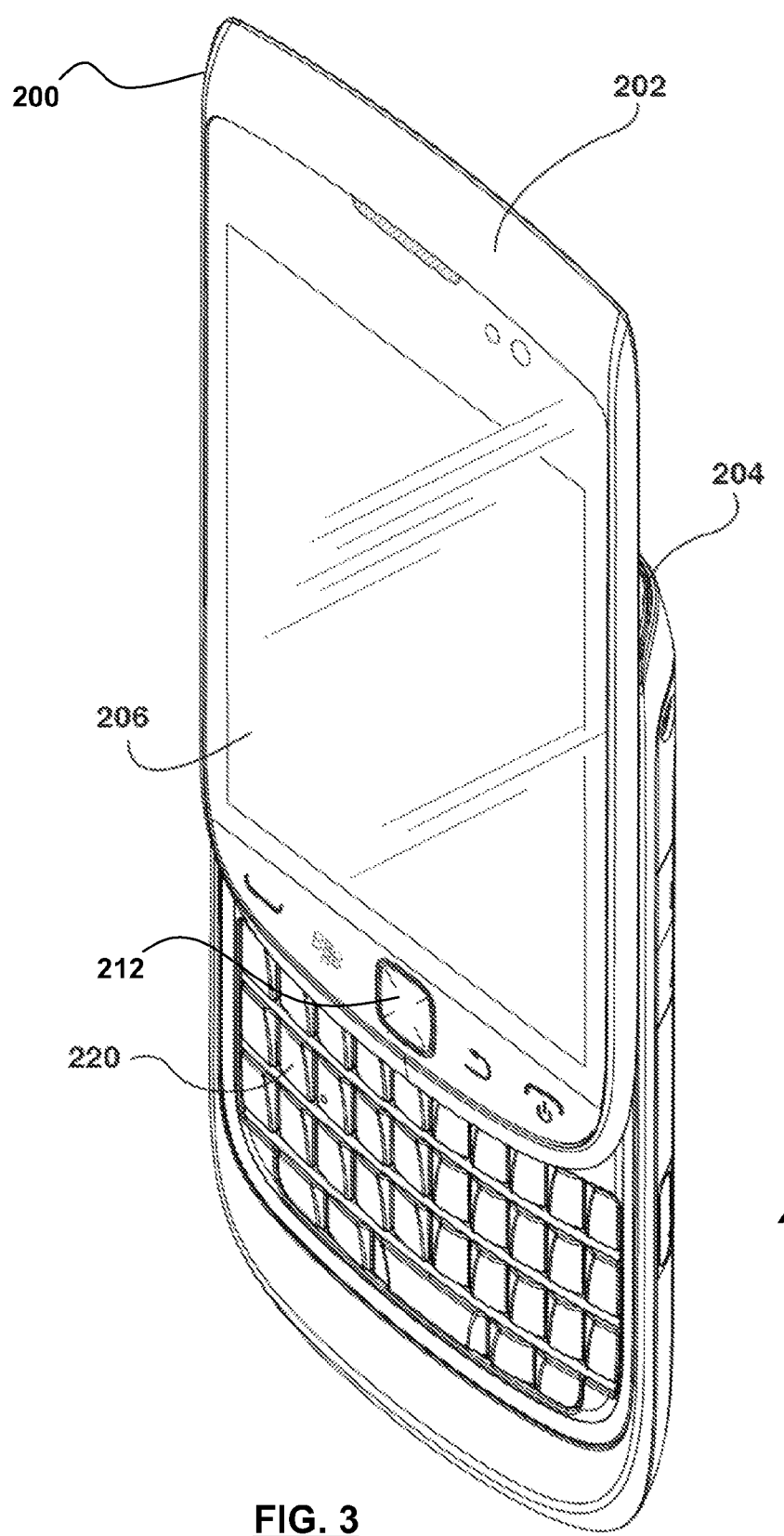
FIG. 3 is a second perspective view of the portable electronic device of FIG. 2 shown in an open position.

Turning now to FIGS. 2 and 3, illustrated generally therein is a portable electronic device 200. As shown, in this embodiment the portable electronic device 200 is a "slider" or "sliding" device that includes an upper housing 202 (sliding portion) and a lower housing 204 (base portion). The upper housing 202 and lower housing 204 are coupled together and are slidable between a closed position (as shown in FIG. 2) and an open position (e.g. as shown in FIG. 3) generally along a direction aligned with the x-axis.

The upper housing 202 in this embodiment includes a display 206, which could be an LCD, which may have touch screen capabilities (and which could be the touch screen display 118 identified in FIG. 1).

For clarity, the coordinate system shown in FIGS. 2 and 3 has been defined having the x-axis aligned with the direction of sliding of the upper and lower housings 202, 204, the y-axis normal to the plane of the display 206, and the z-axis perpendicular to the x-axis and y-axis. For consistency, the same relative coordinate system is also shown in FIGS. 4 to 7.

In some embodiments, one or both of the upper housing 202 and lower housing 204 may include one or more input apparatus, such as navigation keys or buttons, a physical or virtual keyboard, a trackpad, trackball, multimedia keys, and the like. For example, the upper housing 202 in this embodiment includes an auxiliary input device 212. The auxiliary input device 212 may be an optical navigation module (e.g. a trackpad or optical joystick) that responds to user interaction, and which may be used for navigating around the display screen 206, to select objects on the display screen 206, or for other purposes. In some other embodiments, the auxiliary input device 212 may be a mechanical device that responds to user interaction (e.g. a trackball).

The display 206 and the auxiliary input device 212 are generally disposed on a front of the upper housing 202 and may be exposed for user accessibility when the portable electronic device 200 is in both the open or closed position.

The upper housing 202 may also include other input devices, such as a dedicated phone application button, a "disconnect call" button, a home screen button, and the like. In various embodiments, these input devices may include optical sensors, mechanical buttons, or both.

Turning now specifically to FIG. 3, in some embodiments the portable electronic device 200 may include a keypad 220 in addition to a display 206. In this embodiment, the keypad 220 is provided on the lower housing 204. The keypad 220 generally includes a plurality of alphanumeric keys, which may be positioned in a plurality of rows and columns. In some embodiments, the keys may represent an alphabet and may be arranged in a standard keyboard layout (e.g. QWERTY, QWERTZ, DVORAK, etc.).

In embodiments where the portable electronic device 200 is not a slider device (but is a "candybar" style device, for example), the keypad 220 may be positioned below the display 206.

Figure 4:
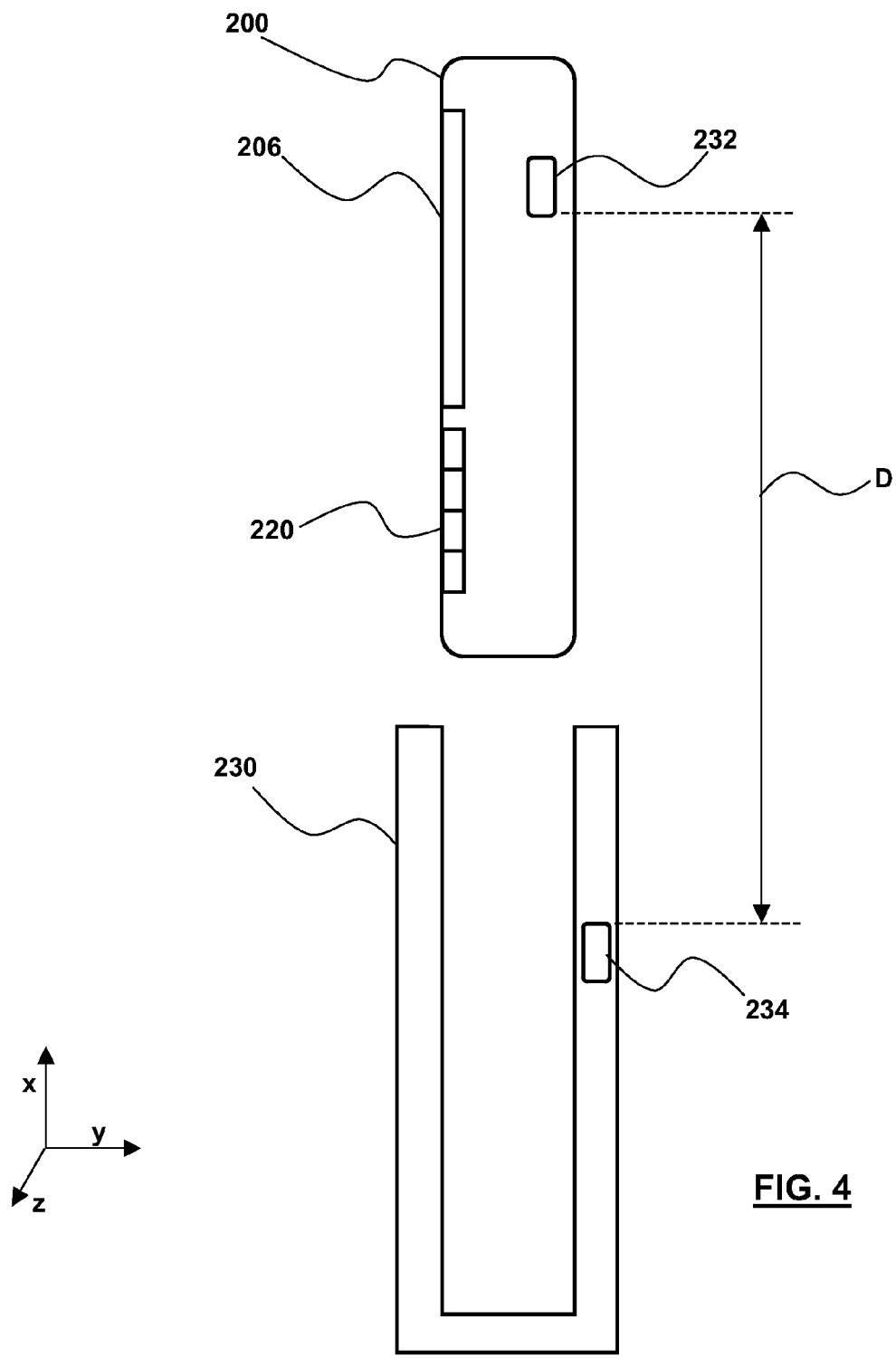
FIG. 4 is a schematic side view of a portable electronic device and a holster with the device out of the holster.

Turning now to FIG. 4, in some embodiments, the portable electronic device 200 is sized and shaped so as to receivable within a holster 230. The holster 230 may be useful for carrying or protecting the device 200. For example, the portable electronic device 200 may be placed in the holster 230 when the portable electronic device 200 is not in use, or when the portable electronic device 200 is being used with a headset or headphones. In some cases, the holster 230 may help prevent accidental key-presses of the keypad 220 or the display 206 (or both) when not desired. In some cases, the holster 230 could be worn on a belt, carried by a user (e.g. in a bag or purse or in their hand), could be adapted to be mounted in a car or another vehicle (e.g. so the portable electronic device 100 can be used as a navigation aid while driving), and so on.

As shown, the portable electronic device 200 includes an electronic compass 232, which could be the same as or similar to the electronic compass 152. In particular, the electronic compass 232 could include a three-axis magneto-impedance sensor or another magnetometer, and which could be adapted to measure magnetic fields along three axes. As described above, the electronic compass 232 may be used for navigational purposes, such as for determining location or direction information (or both) for the portable electronic device 200.

In the embodiments as described herein, the electronic compass 232 is also adapted to detect whether the portable electronic device 200 is located within the holster 230. In particular, the electronic compass is positioned to cooperate with a magnetic element 234 located in the holster 230 to determine whether the device 200 is in (or out) of the holster 230 according to measured magnetic field patterns.

In some embodiments, the magnetic element 234 could be a magnet or another object that has a magnetic field with a pattern that can be detected by the electronic compass 232.

In embodiments where the electronic compass 232 includes a three-axis magneto-impedance sensor, the three-axis magneto-impedance sensor may measure the magnetic field of the magnetic element 234 along at least one of the x-axis, y-axis and z-axis to obtain a measured magnetic field pattern. This measured magnetic field pattern may then be compared to a known pattern to determine whether the portable electronic device 200 is in the holster 230.

As used herein, the term "known pattern" may include "learned" patterns that are learned by the portable electronic device 200 during use, and which may in some embodiments be associated with one or more particular holsters 230. For example, the portable electronic device 200 and holster 230 may be "paired" together by having a user insert the portable electronic device 200 into the holster 230 and then perform some action (e.g. press a particular button). A "known pattern" may also include preset or predetermined patterns, for example one or more patterns provided to the portable electronic device 200 by the manufacturer of the portable electronic device 200, of the holster 230, or both. In some cases, "known patterns" may include patterns sent to the portable electronic device 200, for example using the communication subsystem 104.

Returning again to FIG. 4, when the portable electronic device 200 is out of the holster 230, the distance D between the electronic compass 232 and the magnetic element 234 may be sufficiently large so that the electronic compass 232 generally does not detect a significant pattern associated with the magnetic element 234.

Figure 5:
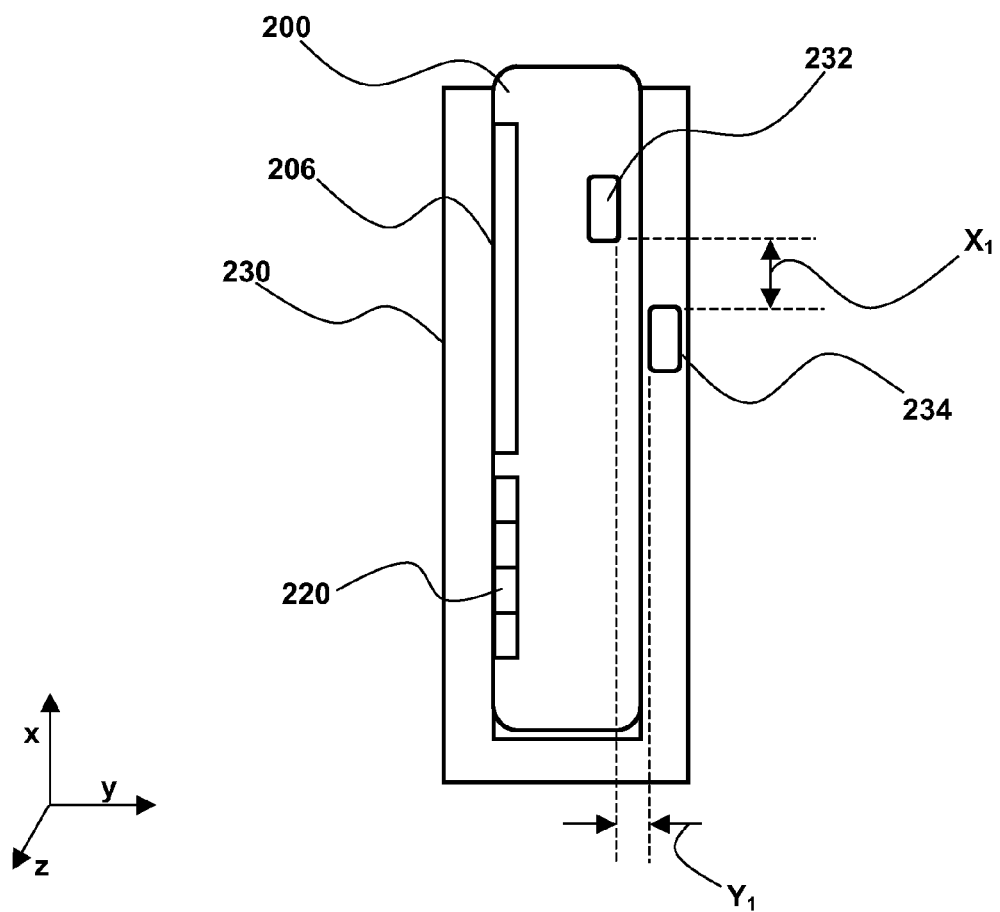
FIG. 5 is a schematic side view of the portable electronic device and the holster of FIG. 4 with the portable electronic device received in the holster in a first orientation.
Figure 6:
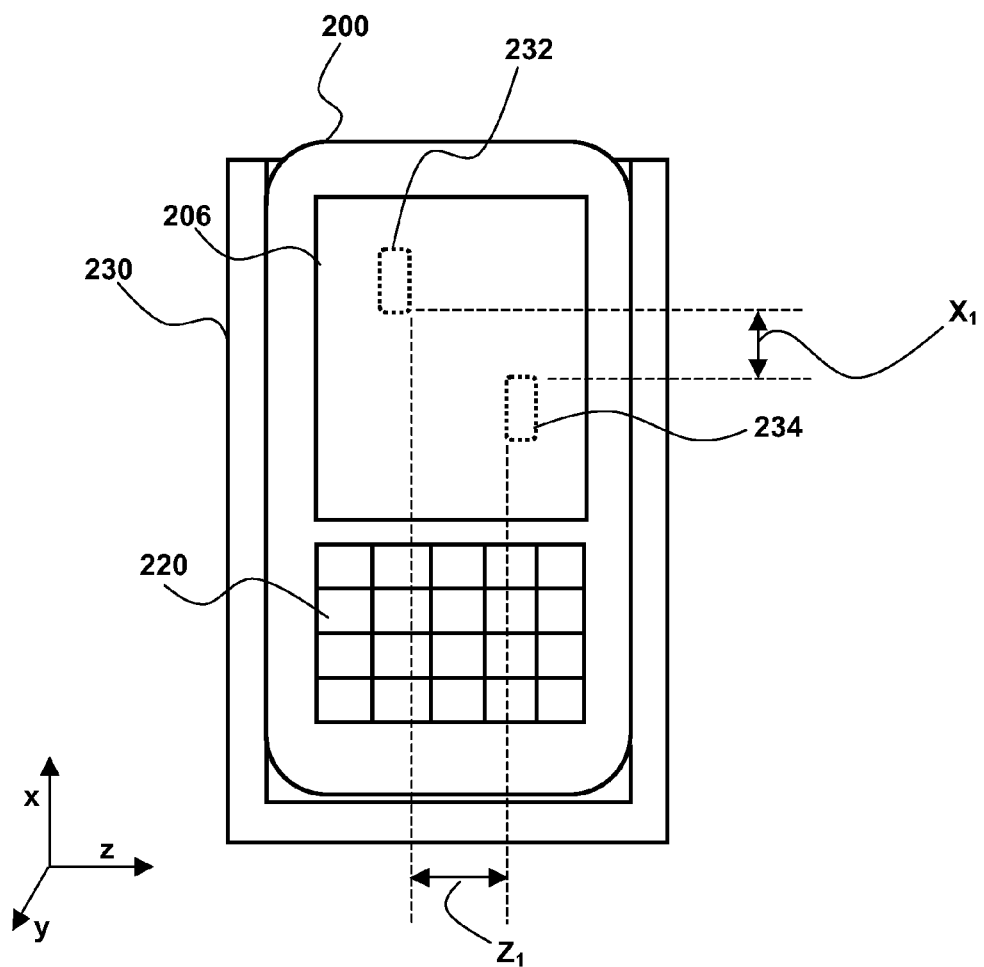
FIG. 6 is a schematic front view of the portable electronic device and the holster of FIG. 5.

However, as shown in FIGS. 5 and 6, when the portable electronic device 200 is in the holster 230 (in this case in a first orientation), the electronic compass 232 can measure the magnetic field strength of the magnetic element 234 along the three axes: the x-axis (based on the distance $X_1$ along the x-axis), the y-axis (based on the distance $Y_1$ along the y-axis) and the z-axis (based on the distance $Z_1$ along the z-axis as shown in FIG. 6). These measured field strengths when the portable electronic device 200 is in the holster 230 can be recorded as a "first pattern" and associated with the portable electronic device 200 being in the first orientation in the holster 230.

Accordingly, when the electronic compass 232 detects a measured pattern that corresponds to the first pattern, a determination can be made that the portable electronic device 200 is in holster 230. Furthermore, when the measured pattern corresponds to the first pattern, a determination can optionally be made that the portable electronic device 200 is also in a first orientation.

Advantageously, detecting a pattern across multiple axes (e.g. three axes) may be more robust that than detecting a pattern across a single axis for determining whether a device is in a holster. For example, some devices use a Hall effect sensor to detect a magnet in a holster. A Hall effect sensor is a simple transducer that varies its output voltage in response to changes in a magnetic field. However, a Hall effect sensor only detects a magnetic field along a single axis. Accordingly, to detect the magnet in the holster, the Hall effect sensor generally had to be in close proximity thereto (e.g. the Hall effect sensor and magnet normally had to be substantially aligned when the device was in the holster). This tended to limit placement options of the Hall effect sensor or magnet (or both) when designing a portable electronic device, and made sensing difficult.

In contrast, the use of an electronic compass 232 adapted to detect a pattern of magnetic fields along three different axes allows the electronic compass 232 and magnetic element 234 to be located at various locations (e.g. and not be aligned) while still generally providing robust detection of the holster 230. For example, the electronic compass 232 and magnetic element 234 can be offset by the $X_1$, $Y_1$, and $Z_1$ distances as shown while still providing good detection of the holster 230.

Furthermore, a Hall effect sensor is generally not well suited for detecting whether a device is in a holster in a different orientation. In particular, such detection may be difficult with a Hall effect sensor unless the magnet and Hall effect sensor can be closely aligned in both orientations, or multiple magnets are provided in the holster at different locations to align with the Hall effect sensor when the device is in the different orientations. This latter approach may be particularly undesirable as it may increase the part count and complexity of the holster as well as the cost.

By contrast, the embodiments herein may allow a single electronic compass 232 and a single magnetic element 234 to cooperate to detect whether the portable electronic device 200 is within the hostler 230 and optionally also determine the orientation of the portable electronic device 200 from various possible orientations.

Figure 7:
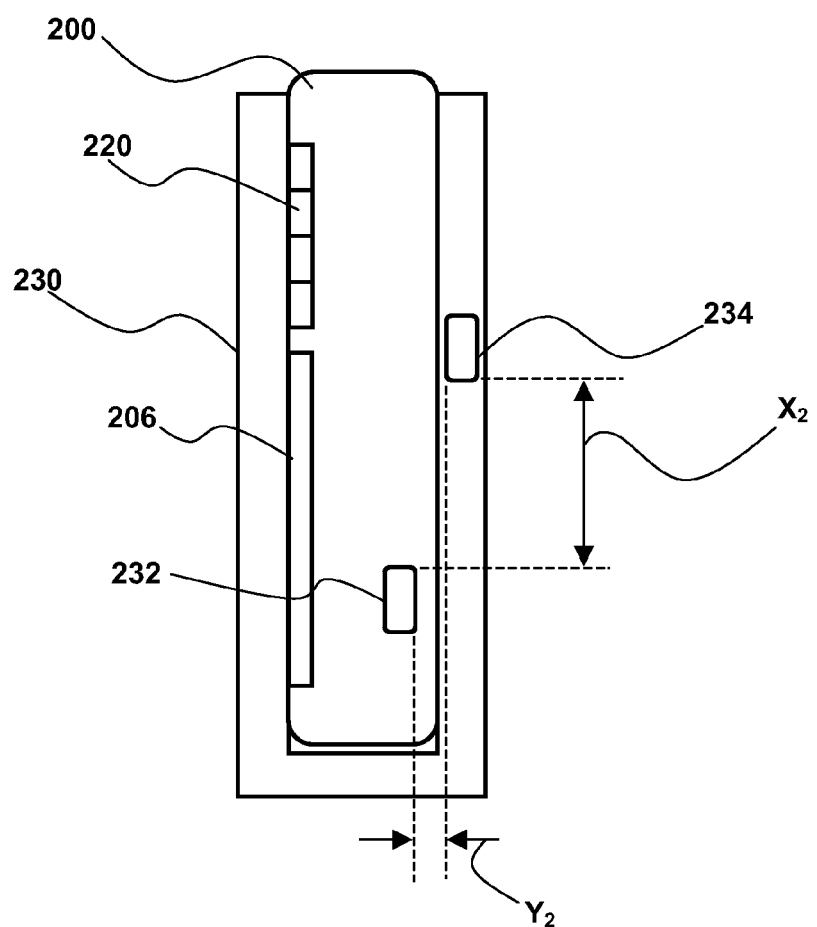
FIG. 7 is a schematic side view of the portable electronic device and the holster of FIG. 4 with the portable electronic device received in the holster in a second orientation.
Figure 7:
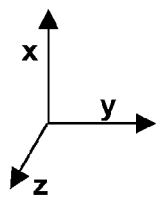

For example, as shown in FIG. 7, the portable electronic device 200 has been inserted into the holster 230 in a second orientation (e.g. with the display 206 end inserted towards the bottom of the holster 230 and the keypad 220 end near the holster 230 opening). At least one of the x, y and z distances between the magnetic element 234 and electronic compass 232 may be different in this orientation (as compared to the first orientation shown in FIGS. 5 and 6). For example, as shown the $X_2$ distance is larger than the $X_1$ distance, although the $Y_2$ distance is the same as the $Y_1$ distance. Although not shown, the $Z_1$ and $Z_2$ distances may also be different between the first and second orientations.

Accordingly, in FIG. 7 a "second pattern" of magnetic fields along the x, y and z-axes may be measured by the electronic compass 232 and associated with the portable electronic device 200 being in the holster 230 in this second orientation.

Thus, when the electronic compass 232 measures a magnetic field that corresponds to this second pattern, a determination can be made that the portable electronic device 200 is in the holster 200 in the second orientation.

This second pattern can be measured without a second additional magnetic element being required in the holster. Accordingly, embodiments herein may allow for detecting that the portable electronic device 200 is in the holster 230 in two or more orientations without additional components or sensors being required. This may be useful, for example, to allow for holster detection even if the user inadvertently places the portable electronic device 200 in the holster 230 in an unconventional direction (e.g. upside down), or when the first or second orientation is deliberately selected.

For example, depending on the shape of the holster 200, the first orientation may be selected to allow the display screen 206 to be exposed when the device 200 is in the holster 230 (e.g. this may be beneficial when the device 200 is being used in a car-mounted holster as a navigation aid), while the second orientation may be selected to fully cover the display 206 (e.g. so as to protect the display 206 or inhibit undesired touch screen presses).

Another example of a third orientation is shown in FIG. 8. In this embodiment, the device 200 has been rotated (from the second orientation) 180 degrees around the x-axis. In the third orientation, the $Y_3$ distance is larger than the $Y_2$ distance, although the $X_3$ distance is the same as the $X_2$ distance (and although not shown, the $Z_3$ and the $Z_2$ distances may also be different). The measured magnetic fields in this third orientation may be stored as a third pattern. When the electronic compass 232 detects a measured pattern that corresponds to this third pattern, a determination can be made that the portable electronic device 200 is in the holster 230 and in the third orientation.

Generally, as described herein the electronic compass 232 and sensor element 234 are adapted to determine whether the portable electronic device 200 is located within the holster 230, and in some embodiments what orientation the device 200 has within the holster 230. In some embodiments, these detections may be useful to allow for enabling or disabling of certain features or taking particular actions based on the whether the portable electronic device 200 is in the holster 230 and what is the particular orientation of the portable electronic device 200 within the holster 230. For example, various "modes" may be triggered depending on whether or not the device 200 is in the holster 230, and what the orientation of the device 200 in the holster 230 is.

Some of the modes may relate to power consumption of the device. For instance, power may be supplied to the all or most components for a "normal" power mode when the portable electronic device 200 is out of the holster 230 (as shown in FIG. 4).

However, when the portable electronic device 200 is in the holster 230, power to one or more components (e.g. the keypad 220, the display 206, the processor 102, etc.) may be at least reduced or even completely interrupted in order to reduce the power consumption of the portable electronic device 200 (e.g. to enable a "low power mode"). This may be useful to extend the operating life of the battery based on a particular charge by deactivating those components that may not be needed when the portable electronic device 200 is in the holster 230 (e.g. the display 206 need not be active when the display 206 is fully covered by a holster 230).

In some embodiments, two or more different modes could be selected according to two or more orientations of the portable electronic device 200 within the holster 230. For example, when the portable electronic device 200 is in the first orientation (as shown in FIGS. 5 and 6), the device 200 may be in a first low power mode wherein substantially all of the components may be de-powered (e.g. including the display 206, the communication subsystem 104, the keypad 220, etc.). This may greatly increase the battery life for a particular charge, and may be useful as "long-lasting" low power mode. However, when in a second orientation (e.g. as shown in FIG. 7) the device may be in a second low power mode where it is desirable that only some of the components are unpowered while other components are powered (e.g. the display 206 may be turned off but the communication subsystem 104 may be kept powered so that emails or voice communications can still be received).

Accordingly, using a three-axis magneto-impedance sensor or another suitable magnetometer to determine that the portable electronic device 200 is in the holster 230 in two or more orientations may allow for more flexible choices when initiating power management modes for the portable electronic device 200.

In some embodiments, the one or modes may refer to other settings that may be adjusted on the device based on whether the portable electronic device 200 is in the holster 230, such as notification or alert settings. For instance, the portable electronic device 200 may be in a "first mode" that uses a vibration alert for an incoming call when the portable electronic device 200 is in the holster 230 in a first orientation, a "second mode" with a ring alert for an incoming call when the portable electronic device 200 is in the holster 230 in a second orientation, and a "third mode" with both a ring and a vibrate for an incoming call when the portable electronic device 200 is out of the holster 230.

In some other embodiments, the electronic compass 152 may be a multi-axis magneto-impedance sensor having less than three axes. For example, the electronic compass 152 could be a two-axis magneto-impedance sensor.

In FIGS. 4 to 7, while the portable electronic device 200 is shown schematically as a candybar style device (with the keypad 220 located beneath the display 206), it will be appreciated that the portable electronic device 200 could be a slider device as shown in FIGS. 2 and 3, a clamshell device (also commonly known as a flip device), a swivel device and so on.

In some cases, using an electronic compass to detect the presence of the holster may eliminate the need for a separate Hall effect sensor to be provided in a portable electronic device. This may reduce the total part count for the portable electronic device, and which may reduce cost and complexity.

Figure 9:
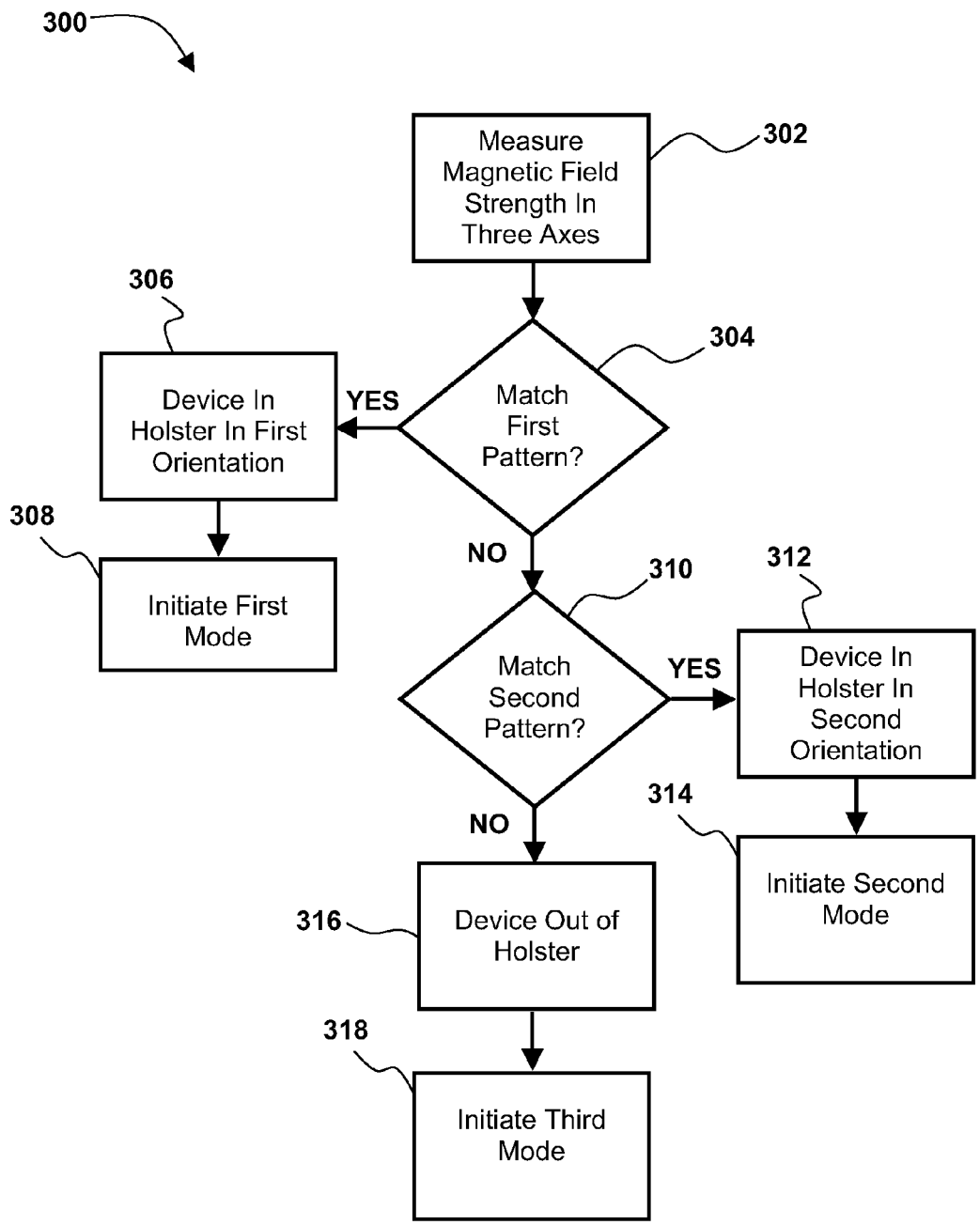
FIG. 9 is a flowchart of a method of detecting when a portable electronic device is in a holster.

Turning now to FIG. 9, illustrated therein is a flowchart showing a method 300 of determining whether a portable electronic device (e.g. the portable electronic device 200 or another portable electronic device) is within a holster (e.g. the holster 230 or another holster) and initiating one or more corresponding modes accordingly (which could be low power modes, alert settings modes, and so on).

At step 302, an electronic compass (e.g. the electronic compass 232 having a three-axis magneto-impedance sensor as described above) on the portable electronic device 200 is used to measure a magnetic field from a magnetic element (e.g. the magnetic element 234) provided on the holster 230. The magnetic field is measured in three axes to obtain a measured pattern.

At step 304, a determination is made as to whether the measured pattern corresponds to a first pattern associated with the portable electronic device 200 being provided in the holster 230 in the first orientation. If the patterns match, then the method 300 proceeds to step 306 where it is noted that the device 200 is in the holster 230 and in a first orientation. The method 300 may then proceed to step 308, where a first mode may be initiated (e.g. a first low power may be initiated by interrupting or at least reducing power to a number of components, including the display 206, the communication subsystem 104, and keypad 220), or another action may be taken (e.g. the alert settings may be changed for the portable electronic device 200 to activate a vibration alert).

Otherwise, if at step 304 the patterns do not match, the method 300 then proceeds to step 310.

At step 310, a determination is made as to whether the measured magnetic pattern corresponds to second pattern associated with the device 200 being in the holster 230 in a second orientation. If these patterns match, then the method 300 proceeds to step 312 where it is noted that the device 200 is in the holster 230 and in a second orientation. The method 300 may then proceed to step 314 where a second mode may be initiated (e.g. power may be cut to only some components, such as the display 206 only, while the communication subsystem 104 may remain actively powered so that emails can be received), or another action may be taken (e.g. the alert settings may be changed for the portable electronic device 200 to activate a ring alert).

Otherwise, if at step 310 the patterns do not match, the method 300 then proceeds to step 316.

In some embodiments, at step 316 a determination is made that the device 200 is out of the holster 230. The method may then proceed to step 318 where a third mode may be initiated. This could be a "normal" power mode in some embodiments with all or most components of the device 200 being powered, or another action may be taken (e.g. the alert settings may be changed for the portable electronic device 200 to activate both a ring and vibration alert).

In other embodiments, further comparisons may be made of the measured pattern and other known patterns that are associated with other orientations (e.g. the third pattern associated with the third orientation as shown in FIG. 8). This may be repeated for each of various known patterns until all known patterns have been checked, and if no match is found, then a determination may be made that the portable electronic device 200 is out of the holster 230.

In some embodiments, regardless of the particular orientation of the portable electronic device 200 within the holster 230, the modes (e.g. the low power mode or alert mode) may be the same.

Generally, as the portable electronic device 200 moves into and out of the holster 230, the magnetic field between the electronic compass 232 and magnetic element 234 will vary. Thus, in some embodiments the method 300 may be repeated according to a particular polling schedule to continuously monitor whether the device 200 is in the holster 230 and take an appropriate desired action.

Some embodiments herein have referred to a slidable or "slider" portable electronic device that includes a housing, a touch-sensitive display exposed by a front of the housing, and functional components including memory and a processor coupled to the memory and the touch-sensitive display. The touch-sensitive display may also be referred to as a touchscreen display. However, the teachings herein are not limited to slidable or slider electronic devices or to touchscreen devices, but may apply to other types of portable electronic devices such as candybar or slab devices, clamshell or flip devices, swivel devices, and various combinations thereof. In particular, in some examples, the devices may include a keypad and touchscreen, and may include one or more auxiliary buttons, or may include a touchscreen without a keypad.

While the above description provides examples of one or more processes or apparatuses, it will be appreciated that other processes or apparatuses may be within the scope of the accompanying claims.

The invention claimed is:

1. A portable electronic device sized and shaped to be received within a holster in a plurality of orientations, the portable electronic device comprising:
   a communication module adapted to provide data communications and voice communications over a wireless network;
   an electronic compass including a single magnetometer, the single magnetometer adapted to measure a magnetic pattern of a single magnetic element in the holster along three axes when the portable electronic device is received within the holster; and
   a processor adapted to:
      compare the measured pattern with at least one known magnetic pattern associated with the single magnetic element for at least one of the plurality of orientations to determine whether the portable device is received within the holster, and if so, whether the portable electronic device is in a first orientation or a second orientation of the plurality of orientations;
      if the device is in the holster, then initiate a low power mode; and
      if the device is out of the holster then initiate a normal power mode.

2. The portable electronic device of claim 1, wherein the first orientation is associated with a first magnetic field pattern and has a first low power mode, and the second orientation is associated with a second magnetic field pattern and has a second low power mode.

3. The portable electronic device of claim 2 wherein the first low-power mode includes reducing power to one or more components of the portable electronic device, and the second low power mode includes reducing power to one or more other components of the portable electronic device.

4. A portable electronic device sized and shaped to be received within a holster having a single magnetic element, the portable electronic device comprising
   a communication module adapted to provide data communications and voice communications over a wireless network;
   an electronic compass having a single magnetometer adapted to measure a magnetic pattern of the single magnetic element in the holster in at least two axes; and
   a processor adapted to determine that the portable electronic device is in the holster when the measured pattern matches a first known pattern associated with the magnetic element and out of the holster then the measured pattern does not match the first pattern.

5. The portable electronic device of claim 4, wherein the single magnetometer is adapted to measure the magnetic pattern along three axes.

6. The portable electronic device of claim 4, wherein the portable electronic device is adapted to initiate a first mode when the determination is made that the portable electronic device is in the holster.

7. The portable electronic device of claim 6, wherein the first mode is a low power mode.

8. The portable electronic device of claim 7, wherein the first mode includes adjusting an alert setting.

9. The portable electronic device of claim 4, wherein the portable electronic device is sized and shaped to be received in the holster in at least two orientations, and the single magnetometer and single magnetic element cooperate so that the portable electronic device can determine the orientation of the portable electronic device within the holster.

10. The portable electronic device of claim 9, wherein the at least two orientations comprise a first orientation associated with a first known magnetic pattern and a second orientation associate with a second known magnetic pattern.

11. The portable electronic device of claim 10, wherein the portable electronic device is adapted to trigger a first mode when the portable electronic device is in the first orientation and a second mode when the portable electronic device is in the second orientation.

12. The portable electronic device of claim 4, wherein the electronic compass comprises a magneto-impedance sensor having at least two axes.

13. A method of detecting whether a portable electronic device is in a holster, the method comprising:
   providing a communication module adapted to provide data communications and voice communications over a wireless network;
   providing an electronic compass on the portable electronic device, the electronic compass including a single magnetometer;
   providing a single magnetic element on the holster;
   using the magnetometer, measuring a magnetic pattern of the single magnetic element along at least two axes;
   comparing the measured pattern to a first known pattern, and if the measured pattern matches the first known pattern, then determining that the device is in the holster.

14. The method of claim 13, further comprising initiating a first mode when the measured pattern matches the first known pattern.

15. The method of claim 13, further comprising determining that the portable electronic device is in a first orientation within the holster based on the match of the measured pattern with the first known pattern.

16. The method of claim 13, further comprising, if the measured pattern does not match the first known pattern, comparing the measured pattern to a second known pattern, and if the measured pattern matches the second pattern, determining that the portable electronic device is in the holster.

17. The method of claim 16, further comprising determining that the portable electronic device is in a second orientation within the holster based on the match of the measured pattern with the second pattern.

18. The method of claim 16, further comprising initiating a second mode when the measured pattern matches the second pattern.

19. The method of claim 13, further comprising:
   comparing the measured pattern with a plurality of known patterns for a plurality of orientations;
   if the measured pattern matches at least one of the plurality of known patterns, initiate a corresponding low power mode; and
   if the measured pattern does not match at least one of the plurality of known patterns, determining that the device is out of the holster and initiating a normal power mode.

20. The method of claim 13, wherein the electronic compass comprises a magneto-impedance sensor having three axes, and the magnetic pattern is measured along three axes.

* * * * *